United States Patent
Lee

(10) Patent No.: US 7,161,831 B2
(45) Date of Patent: Jan. 9, 2007

(54) LEAF PLOT ANALYSIS TECHNIQUE FOR MULTIPLE-SIDE OPERATED DEVICES

(75) Inventor: Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 54 days.

(21) Appl. No.: 11/150,799

(22) Filed: Jun. 10, 2005

(65) Prior Publication Data

US 2006/0279987 A1     Dec. 14, 2006

(51) Int. Cl.
*G11C 11/34* (2006.01)
*G11C 16/04* (2006.01)

(52) U.S. Cl. ............... 365/185.03; 365/185.01; 365/185.24

(58) Field of Classification Search ........... 365/185.03, 365/185.01, 185.24; 324/600, 606
See application file for complete search history.

(56) References Cited

U.S. PATENT DOCUMENTS

| | | | |
|---|---|---|---|
| 5,768,192 A | | 6/1998 | Eitan |
| 6,320,784 B1 | | 11/2001 | Muralidhar et al. |
| 7,038,928 B1 | * | 5/2006 | Hsu et al. .......... 365/104 |
| 7,079,437 B1 | * | 7/2006 | Hazama et al. ..... 365/210 |
| 2002/0185674 A1 | * | 12/2002 | Kawashima et al. .... 257/315 |
| 2004/0141372 A1 | * | 7/2004 | Matsui ............ 365/185.03 |
| 2005/0030816 A1 | * | 2/2005 | Banks ............ 365/222 |
| 2005/0207229 A1 | * | 9/2005 | Takeuchi .......... 365/185.25 |
| 2005/0281085 A1 | * | 12/2005 | Wu .............. 365/185.19 |

OTHER PUBLICATIONS (Yeh, et al.), 4 pages (International Electron Devices Meeting Digest, 2002, pp. 931-934 PUB Date: Dec. 8-11, 2002.

* cited by examiner

*Primary Examiner*—Van Thu Nguyen
*Assistant Examiner*—Toan Le
(74) *Attorney, Agent, or Firm*—Akin Gump Strauss Hauer & Feld, LLP

(57) ABSTRACT

A method for analyzing the interaction between threshold states of a multiple-bit memory cell on a coordinate system is provided. The coordinate system is formed using a plurality of axes with one axis being a threshold state of a first side of a memory cell and the second axis being a threshold state of a second side of a multiple-bit memory cell. An operation is initiated on the first side of the memory cell from a start point and continues to a first target point of the first side. Then, a trace is plotted from the start point of the first side of the memory cell to a target point of the first side of the memory cell. This plot illustrates the interaction of the threshold state of the first side of the memory cell to the threshold state of the second side of the memory cell.

18 Claims, 4 Drawing Sheets

LEAF PLOT ANALYSIS TECHNIQUE FOR MULTIPLE-SIDE OPERATED DEVICES

BACKGROUND OF THE INVENTION

There are many memory devices that have different voltage threshold (Vt) states by storing different amounts of charges in their memory cells. A two-sided memory device cell has a transistor with two sides (i.e., the drain or source side of a transistor) separated by a channel in the substrate for storing a charge as shown in FIG. 1 of U.S. Pat. No. 5,768,192 (Eitan). However, the voltage threshold (Vt) state of one side of the memory cell could interact with the other side of the memory cell during an operation. This interaction between the sides of the memory cell makes it difficult to analyze or to predict the Vt variation during the memory device operation.

Prior art, such as U.S. Pat. No. 6,320,784 (Muralidhar et al.) at column 2, lines 32–36, discusses a method for programming nanocrystals. However, no threshold state interaction analysis is discussed for this device for each side of the memory cell. In addition, U.S. Pat. No. 5,768,192 (Eitan) at column 2, lines 41–65 and column 3, line 16 through column 4, line 3, discusses the operation of NROM cells. However, two-sided voltage threshold analysis is not presented to show the interaction from one side of the memory cell to the other side of the memory cell. Furthermore, a paper published in the International Electron Devices Meeting Digest, 2002, pages 931–934 (Yeh et al.) discusses the operation of PHINES cells and the threshold voltage for each operating condition, but does not discuss an analysis method of the two-sided voltage threshold interactions for its memory cell.

SUMMARY OF THE INVENTION

The present invention provides a method of analyzing an interaction of threshold states of a multiple-bit memory cell associated with a memory device by plotting each threshold state for each side of the memory cell on a coordinate system. The memory device has a plurality of memory cells comprising a plurality of threshold states. The coordinate system comprises a plurality of axes with one axis associated to a threshold state. Each axis is associated to a side of a multiple-bit memory cell, thereby allowing an analysis of the interaction between the threshold states of different sides of the memory cell.

The traces plotted on the coordinate system show the threshold states of the multiple-bit memory cell for the sides on the same plot for the device under a particular operation condition. An operation (e.g., programming, reading, or erasing) is initiated on one side of the memory cell from a start point to a target point. From this operation, a plot is created of the threshold states for each side of the memory cell. Since the coordinate system illustrates the threshold states for each side of the multiple-bit memory cell together, the interaction of the threshold states of sides of the memory cell to one another can be analyzed.

DETAILED DESCRIPTION OF THE INVENTION

Figure 1:
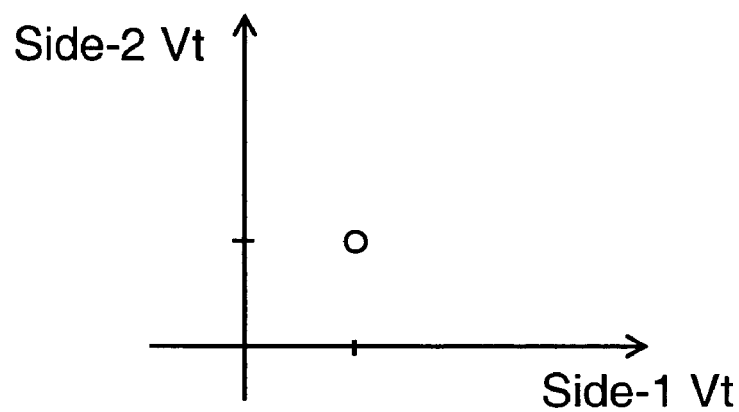
FIG. 1 shows one combinational memory state that illustrates the interaction of the threshold state of one side of the memory cell to the threshold state of the other side of the memory cell.

The leaf plot of the present invention is an analysis method that is based on a coordinate system that uses a plurality of axes. The axes of the coordinate system can be separated from one another by any defined angle. Each axis is associated to each side's threshold state of a multiple-bit memory cell and the other axes are for the other side's threshold state of the memory cell. Every point in the coordinate system corresponds to one combinational memory state (e.g., a different threshold state combination for each point). FIG. 1 shows one combinational memory state for a threshold state of one side and one threshold state of the other side on the plot for a two-axis coordinate system.

Figure 2:
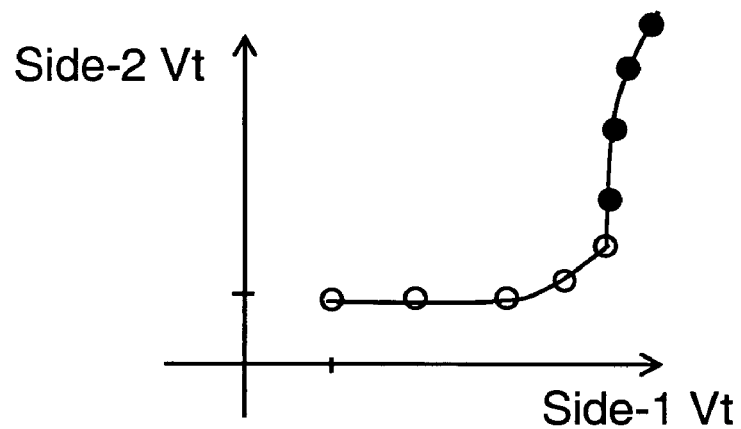
FIG. 2 illustrates the interaction of the threshold state of one side of the memory cell to the threshold state of the memory cell of the other side for an operation from a start point to a first target point and then an operation on the other side from the first target point to a second target point.

To create the leaf plot, an operation condition is initialized, wherein an operation can be any of the following: program (e.g., write), read, or erase operation, on the first side of the memory cell. Next, begin plotting the threshold state on the coordinate system from a start point (e.g., an erase state) to a target point of the first side of the memory cell. After completing the operation to the target point of the memory cell, next program a second side of the memory cell. Then plot its threshold state on the coordinate system from the target point of the first side of the memory cell to a first target point of the second side of the memory cell. FIG. 2 illustrates this operation, wherein the operation initiated on the first side from a start point to a target point of the first side is illustrated by the clear circles. The operation then continues on the second side from the target point of the first side to the first target point of the second side as illustrated by the filled circles. The operation is initiated again on first side and the threshold state is plotted on the coordinate system from the first target point of the second side to a second target point of the first side of the memory cell. To complete the leaf plot, initiate the operation on the first side and plot the threshold state on the coordinate system from the second target point of the first side to the first point of the second side.

Figure 3:
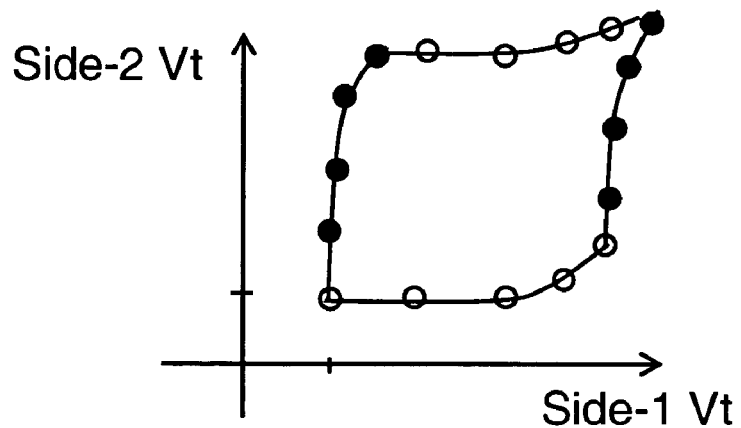
FIG. 3 shows a "Leaf Plot" that illustrates the interaction of the threshold state of one side of the memory cell to the threshold state of the other side of the memory cell for a complete operation.

FIG. 3 illustrates a complete leaf plot wherein the clear circles represent the operation completed on one side of the memory cell and the filled circles represent the operation completed on the second side of the memory cell. This leaf plot illustrates the interaction of the threshold state of one side to the threshold state at another side of the memory cell.

The same leaf plot of FIG. 3 can be created regardless of which side the memory cell the operation is initialized first. This is a feature of the leaf plot in that the leaf plot will be identical for the same device under the same operation condition regardless of which side of the memory cell the operation is first initiated. Therefore, the traces form a shape of the leaf plot is dependent on the operation and the different device structures being analyzed, wherein a unique leaf plot exists for each device and operation.

Figure 4:
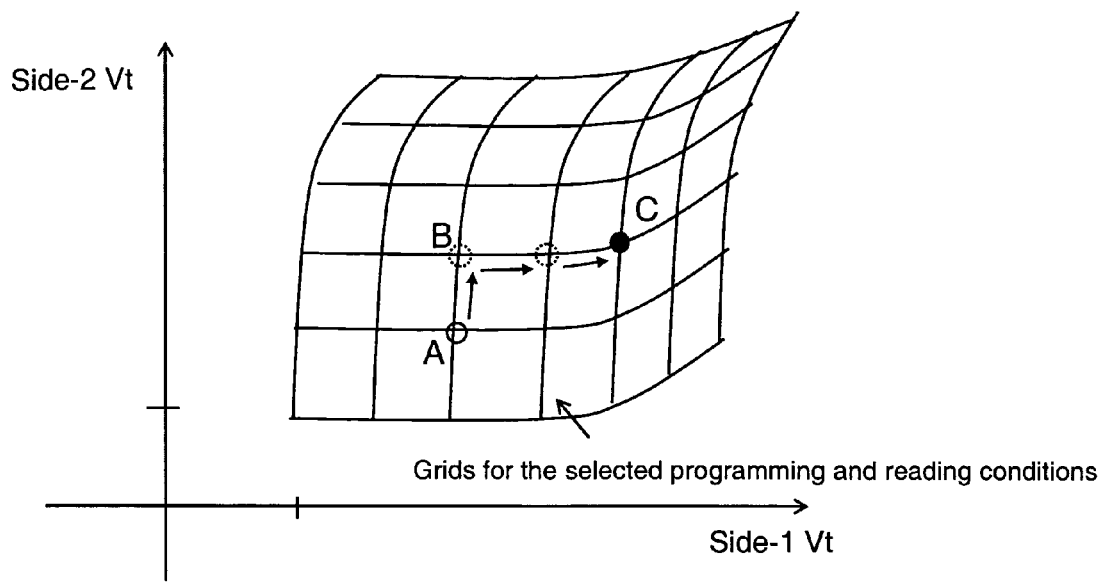
FIG. 4 shows a step process from a start point to a target point and illustrates the grids for the selected programming and read conditions.

One embodiment of the present invention is programming (e.g., writing) a memory cell of a two-side memory device wherein a memory device is a flash memory device. By applying different target thresholds, fine grids can be defined on the leaf plot for the selected programming and reading conditions, as shown in FIG. 4.

Figure 5:
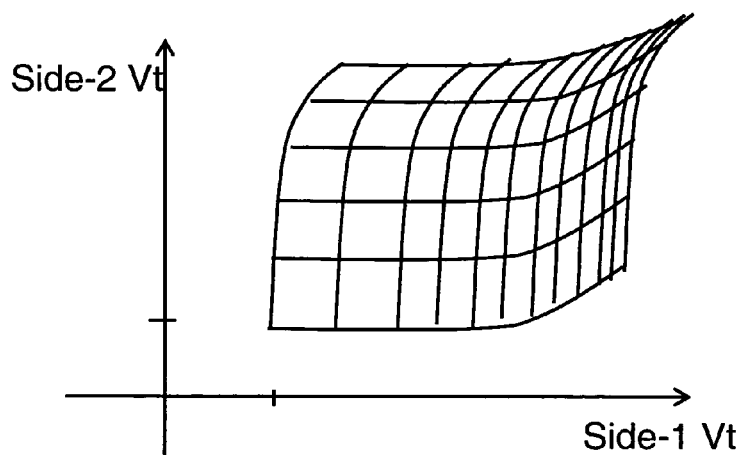
FIG. 5 shows one example of a grid on a "Leaf Plot," whereas different programming and reading conditions will result in different grids.
Figure 6:
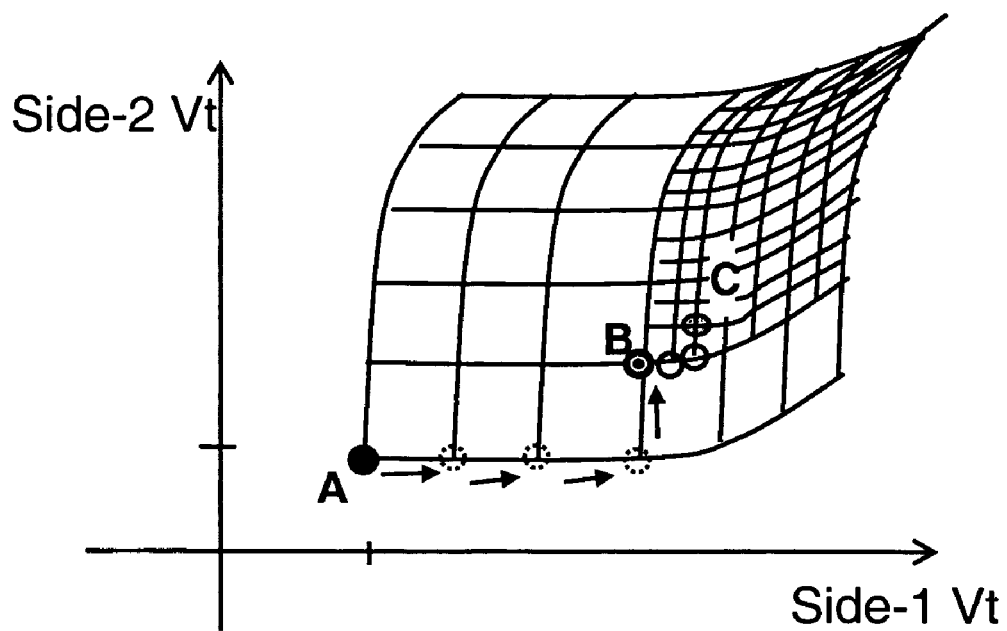
FIG. 6 illustrates a programming condition change and the application of different grids on the "Leaf Plot."

One preferred embodiment of the present invention, can use different programming and reading condition that results in different grids on a leaf plot. FIG. 5 shows the use of different grids for the programming condition, which changes from a coarse grid to a fine grid for the memory cell. For example, FIG. 6 shows that the device starts at an erase state located at point A. Then, using a coarse programming condition, the threshold state moves to a new target state at point B, and then the programming condition changes to a fine-tune programming condition to another target threshold state at point C.

Figure 7:
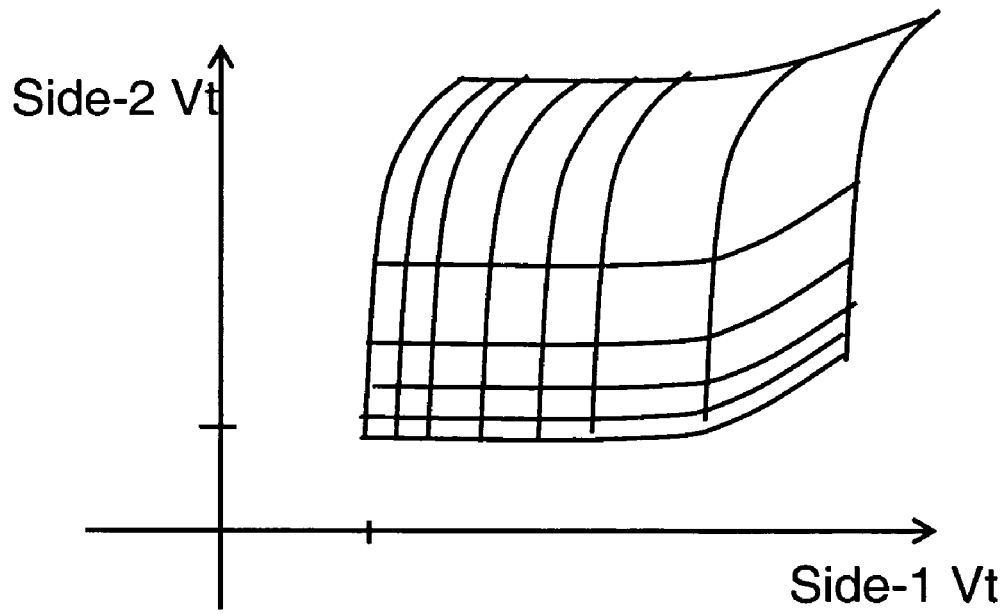
FIG. 7 illustrates the grid for a Leaf Plot for an erase operation.

A second preferred embodiment for the present invention is plotting the targets for an erase operation of a memory cell for a memory device. Similar to programming, the erase operation results in a different grid for a leaf plot as shown in FIG. 7. The shape and the grid of a leaf plot for the erase operation is also dependent on the device. Each device will have its own leaf plot for each operation condition. This allows one to analyze the operating conditions and predict the operating window of any memory device.

Figure 8:
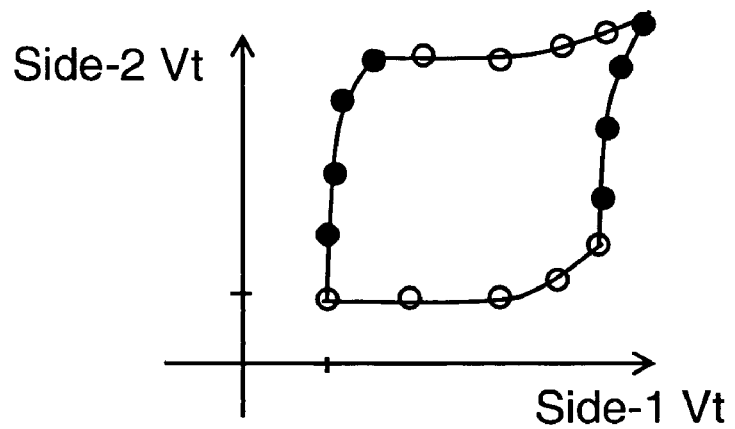
FIG. 8 shows a Leaf Plot for a device under a drain read condition.
Figure 9:
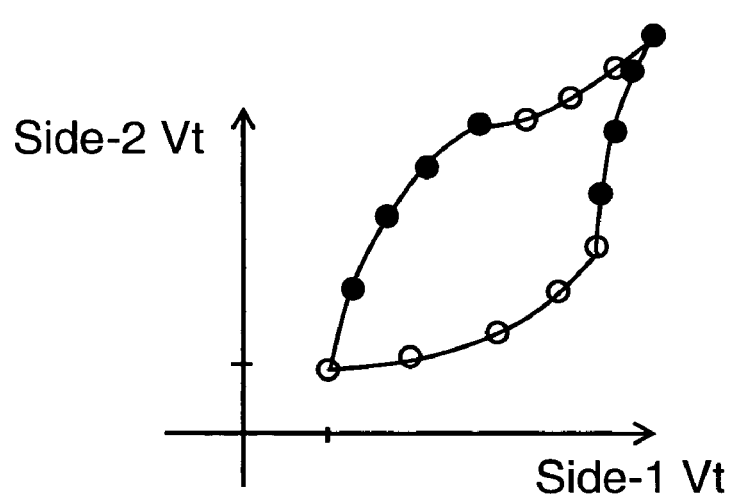
FIG. 9 shows a Leaf Plot for the same device as in FIG. 8 but undergoing a different drain read condition.

A third preferred embodiment for the present invention is plotting the threshold target states for a reading operation of a device. A different leaf plot exists for different device structures and for different reading and programming conditions. For example, FIGS. 8 and 9 illustrate two different leaf plots for the same device. However, each plot shows that a different drain read bias condition creates different plots for the same device undergoing different operations.

Figure 10:
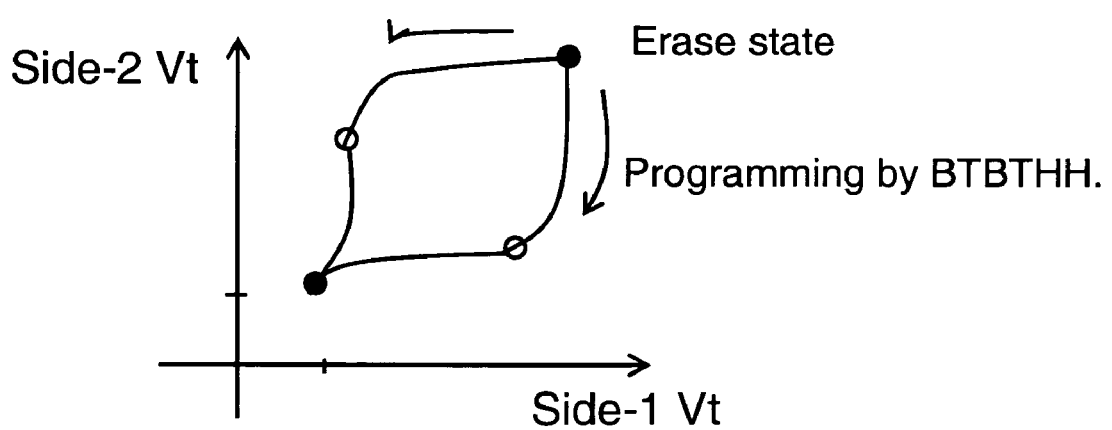
FIG. 10 shows a Leaf Plot for a PHINES device.

A fourth preferred embodiment of the present invention is for programming the PHINES cell. The programming voltage threshold for the cell can be either upwards or downwards of the voltage threshold levels. When programming is initiated, it can start either at a high or low voltage threshold level, which is a characteristic of a device. For example, an erase state of a PHINES cell is at a high voltage threshold and when programming this cell, it starts at its high voltage threshold level and programs to a lower voltage threshold level. To complete the operation, a PHINES memory cell requires using injection of band-to-band-tunneling hot holes (BTBTHH) to program to the storage layer. This programming condition decreases the voltage threshold level from the high state to a lower voltage threshold state. FIG. 10 illustrates a leaf plot for programming a PHINES memory cell.

The leaf plot provides a method to analyze or predict the voltage threshold states under different device operations, regardless of whether the operation condition is a program (e.g., write), an erase or a read operation. The leaf plot and its method of analysis can be applied to all physically multiple-bit-per-cell devices such as NROM, nanocrystal memory, programming by hot-hole injection nitride electron storage (PHINES), asymmetric two-side program one-side read memory (ATPOR), two-side split gate memory, two-side space storage memory, and other devices that have multiple physical storage sites.

The method of analyzing a memory cell of a memory device by creating a leaf plot, makes it easy to understand the device operation window. In addition, it aids to analyze the device under different operating conditions, and predict the memory state of the device under complex operating algorithms.

What is claimed is:

1. A method of analyzing an interaction of threshold states in a multiple-bit memory cell associated with a memory device, the memory cell comprising a plurality of sides for storing a charge, the method comprising:
   (a) defining a coordinate system having a plurality of axes, one axis being a threshold state of a first side of a memory cell, another axis being a threshold state of a second side of the memory cell;
   (b) initiating an operation on the first side of the memory cell; and
   (c) plotting the threshold state on the coordinate system from a start point to a target point of the first side of the memory cell, wherein the plot illustrates the interaction of the threshold state of the first side of the memory cell to the threshold state of the second side of the memory cell.

2. The method of claim 1 further comprising:
   (d) initiating the operation on the second side of the memory cell; and
   (e) plotting the threshold state on the coordinate system from the target point of the first side of the memory cell to a first target point of the second side of the memory cell, wherein the plot illustrates the interaction of the threshold state of the first side of the memory cell to the threshold state of the second side of the memory cell.

3. The method of claim 2 further comprising:
   (f) initiating the operation on the second side of the memory cell; and
   (g) plotting the threshold state on the coordinate system from the target point of the first side of the memory cell to a second target point of the second side of the memory cell, wherein the plot illustrates the interaction of the threshold state of the first side of the memory cell to the threshold state of the second side of the memory cell.

4. The method of claim 3 further comprising:
   (h) initiating the operation on the first side of the memory cell; and
   (i) plotting the threshold state on the coordinate system from the second target point of a second side of the memory cell to the first target point of the second side of the memory cell, wherein the plot illustrates the interaction of the threshold state of the first side of the memory cell to the threshold state of the second side of the memory cell, the combination of plots in steps (c), (e), (g) and (i) forming a leaf shape.

5. The method of claim 1 wherein the multiple-bit memory cell is a two-bit memory cell.

6. The method of claim 5 wherein the two-bit memory cell comprises a transistor that has a drain side and a source side, the drain side and the source side corresponding to the first side and the second side.

7. The method of claim 1 wherein the plurality of axes is two axes.

8. The method of claim 7 wherein the two axes are orthogonal.

9. The method of claim 1 wherein the operation is a write operation.

10. The method of claim 1 wherein the operation is an erase operation.

11. The method of claim 1 wherein the operation is a read operation.

12. The method of claim 1 wherein the threshold state is a threshold voltage.

13. The method of claim 1 wherein the threshold state is a read current.

14. The method of claim 1 wherein the memory device is a flash memory device.

15. The method of claim 1 wherein the memory device is a PHINES memory device.

16. The method of claim 1 wherein the operation uses a coarse programming condition.

17. The method of claim 1 wherein the operation uses a fine programming condition.

18. The method of claim 1 wherein the start point is an erase state.

* * * * *